US009272450B2

(12) United States Patent
Kashiyama et al.

(10) Patent No.: US 9,272,450 B2
(45) Date of Patent: Mar. 1, 2016

(54) INSERT MOLDING METHOD FOR CONNECTOR

(75) Inventors: Motohisa Kashiyama, Makinohara (JP); Masanobu Oishi, Fujieda (JP)

(73) Assignee: YAZAKI CORPORATION, Tokyo (JP)

(*) Notice: Subject to any disclaimer, the term of this patent is extended or adjusted under 35 U.S.C. 154(b) by 93 days.

(21) Appl. No.: 13/698,900

(22) PCT Filed: Jul. 7, 2011

(86) PCT No.: PCT/JP2011/066023
§ 371 (c)(1),
(2), (4) Date: Nov. 19, 2012

(87) PCT Pub. No.: WO2012/005380
PCT Pub. Date: Jan. 12, 2012

(65) Prior Publication Data
US 2013/0062810 A1 Mar. 14, 2013

(30) Foreign Application Priority Data
Jul. 8, 2010 (JP) .................................. 2010-155500

(51) Int. Cl.
| | |
|---|---|
| *B29C 45/14* | (2006.01) |
| *H01R 43/24* | (2006.01) |
| *H05K 3/30* | (2006.01) |
| *H01R 12/58* | (2011.01) |
| *H01R 43/20* | (2006.01) |
| *H01R 43/22* | (2006.01) |
| *H05K 3/34* | (2006.01) |

(52) U.S. Cl.
CPC .......... *B29C 45/14065* (2013.01); *H01R 43/24* (2013.01); *H05K 3/308* (2013.01); *H01R 12/585* (2013.01); *H01R 43/205* (2013.01); *H01R 43/22* (2013.01); *H05K 3/3447* (2013.01); *H05K 2203/0195* (2013.01); *H05K 2203/167* (2013.01)

(58) Field of Classification Search
None
See application file for complete search history.

(56) References Cited

U.S. PATENT DOCUMENTS

| | | | |
|---|---|---|---|
| 5,176,541 A | 1/1993 | Mori | |
| 6,217,393 B1 | 4/2001 | Muta | |

(Continued)

FOREIGN PATENT DOCUMENTS

| | | | |
|---|---|---|---|
| CN | 1239338 A | 12/1999 | |
| DE | 102006033178 A1 | 1/2008 | |

(Continued)

OTHER PUBLICATIONS

International Search Report dated Nov. 9, 2011 from the International Searching Authority in counterpart international application No. PCT/JP2011/066023.

Written Opinion dated Nov. 9, 2011 from the International Searching Authority in counterpart international application No. PCT/JP2011/066023.

(Continued)

*Primary Examiner* — Edmund Lee
(74) *Attorney, Agent, or Firm* — Sughrue Mion, PLLC

(57) ABSTRACT

To provide an insert molding method for a connector which enables terminals to be inserted easily into insertion destination places for the terminals. An insert-molding method for insert molding a connector 1 equipped with a plurality of terminals 10 integrated with a housing 40 and aligned in two rows, includes setting the plurality of terminals 10 in a housing mold 80 to uniform warping directions D of the terminals 10 so that the warping directions D are respectively directed toward outer sides of the rows of the terminals 10.

3 Claims, 6 Drawing Sheets

(56) References Cited

U.S. PATENT DOCUMENTS

| | | | | |
|---|---|---|---|---|
| 6,676,875 | B1 * | 1/2004 | Takeuchi | 264/250 |
| 2001/0049233 | A1 | 12/2001 | Sakakura et al. | |

FOREIGN PATENT DOCUMENTS

| | | | |
|---|---|---|---|
| EP | 0126563 | A1 | 11/1984 |
| EP | 1238774 | A1 | 9/2002 |
| EP | 1401065 | A1 | 3/2004 |
| JP | 58-154253 | A | 9/1983 |
| JP | 2-119380 | U | 9/1990 |
| JP | 2220383 | A | 9/1990 |
| JP | 7-65929 | A | 3/1995 |
| JP | 7-282912 | A | 10/1995 |
| JP | 2001-150481 | A | 6/2001 |
| JP | 2009146852 | A | 7/2009 |
| WO | 9840938 | A1 | 9/1998 |

OTHER PUBLICATIONS

Office Action dated Jul. 22, 2014 issued by the Japanese Patent Office in corresponding Japanese Application No. 2010-155500.

Office Action dated Jun. 19, 2014, issued by the Korean Intellectual Property Office in counterpart Korean Application No. 10-2013-7000523.

Office Action dated Aug. 29, 2014 issued by the Intellectual Property Office of the People's Republic of China in counterpart Chinese Patent Application No. 201180033918.0.

Communication dated Feb. 26, 2015 issued by the Korean Intellectual Property Office in counterpart Korean Patent Application No. 10-2013-7000523.

Office Action, Issued by the Korean Intellectual Property Office, Dated Dec. 30, 2014, In counterpart Korean Application No. 10-2013-7000523.

* cited by examiner

10

INSERT MOLDING METHOD FOR CONNECTOR

TECHNICAL FIELD

The present invention relates to an insert molding method for a connector that has a plurality of terminals.

BACKGROUND ART

Until now, the connector into which the housing and the terminals become integrated by the insert molding is utilized. For example, in PTL 1, the connector in which accuracy of form and strength is improved has been proposed.

By the way, because of a warp of the terminals, in some cases, it is difficult to insert the terminals into insertion destination places in the connector. Therefore, the jig that is capable of aligning a plurality of terminals before these terminals are inserted into the insertion destination places has been proposed. For example, in PTL 2, the automatic assembling equipment that is capable of inserting a plurality of terminals automatically into the holes formed in the housing is set forth. This automatic assembling equipment can align the terminals by causing the comb-teeth shaped jig automatically to put on to the terminals.

CITATION LIST

Patent Literature

[PTL 1] JP-A-2009-146852
[PTL 2] JP-A-2-220383

SUMMARY OF INVENTION

Technical Problem

However, in the connector in which the terminals are arranged in two rows in the housing, even though the comb-teeth shaped jig is used, it is difficult for this comb-teeth shaped jig to contact the terminals in such a situation that the terminals in one row are warped toward the terminals side in the other row, i.e., the terminals are warped toward the inner side between the rows. Consequently, there is a possibility in that it becomes difficult for the terminals to be inserted into insertion destination places for the terminals.

Solution to Problem

The present invention has been made in view of the above circumstances, and it is an object of the present invention to provide an insert molding method for a connector, which enables terminals to be inserted easily into insertion destination places for the terminals.

In order to solve the above problem and achieve the object, this invention is provided with an insert molding method for a connector, which insert molds a connector including a plurality of terminals integrated with a housing and aligned in two rows, comprising setting the plurality of terminals in a housing mold so as to uniform warping directions of the terminals so that the warping directions are respectively directed toward outer sides of the rows of the terminals.

Advantageous Effects of Invention

According to the insert molding method of the present invention, a plurality of signal system terminals that are aligned in two rows are set in the housing mold such that the warping direction are respectively directed to outer sides of the rows of the terminals. Therefore, in the manufactured connector, the comb-teeth shaped jig can be put on to the terminals, which are warped outward from the rows, from the outer side of the rows of the terminals without fail respectively. Consequently, the insertion of the terminals into insertion destination places for the terminals can be facilitated.

DESCRIPTION OF EMBODIMENTS

A preferred embodiment of an insert molding method for a connector according to the present invention will be explained in detail with reference to the drawings hereinafter. Here, it should be noted that the present invention is not limited by this embodiment.

Figure 1:
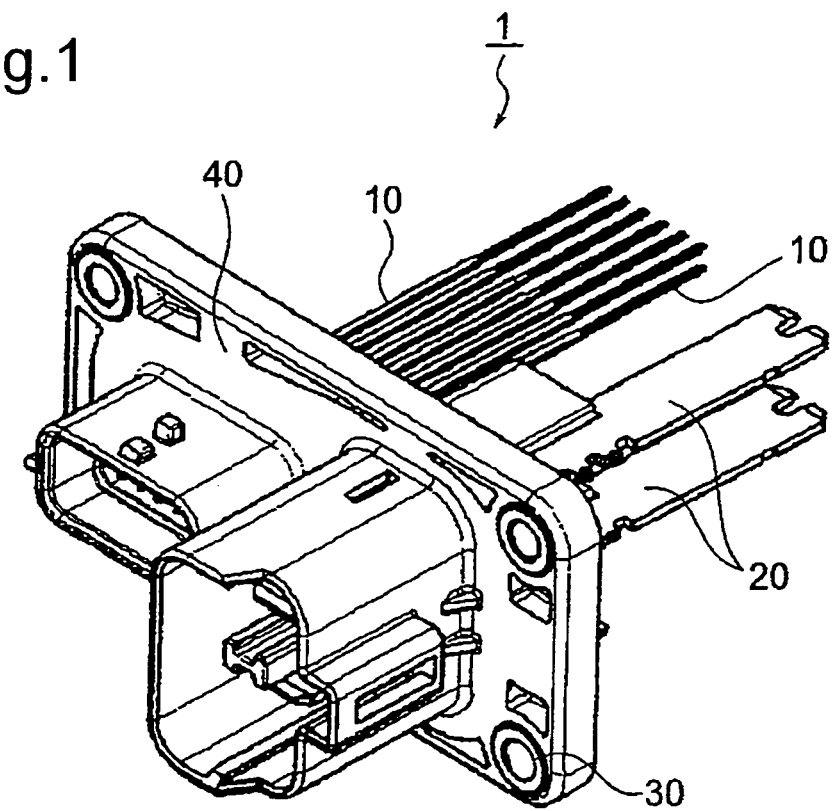
FIG. 1 is a perspective view showing a connector that is manufactured by an insert molding method for a connector according to an embodiment of the present invention.
Figure 2:
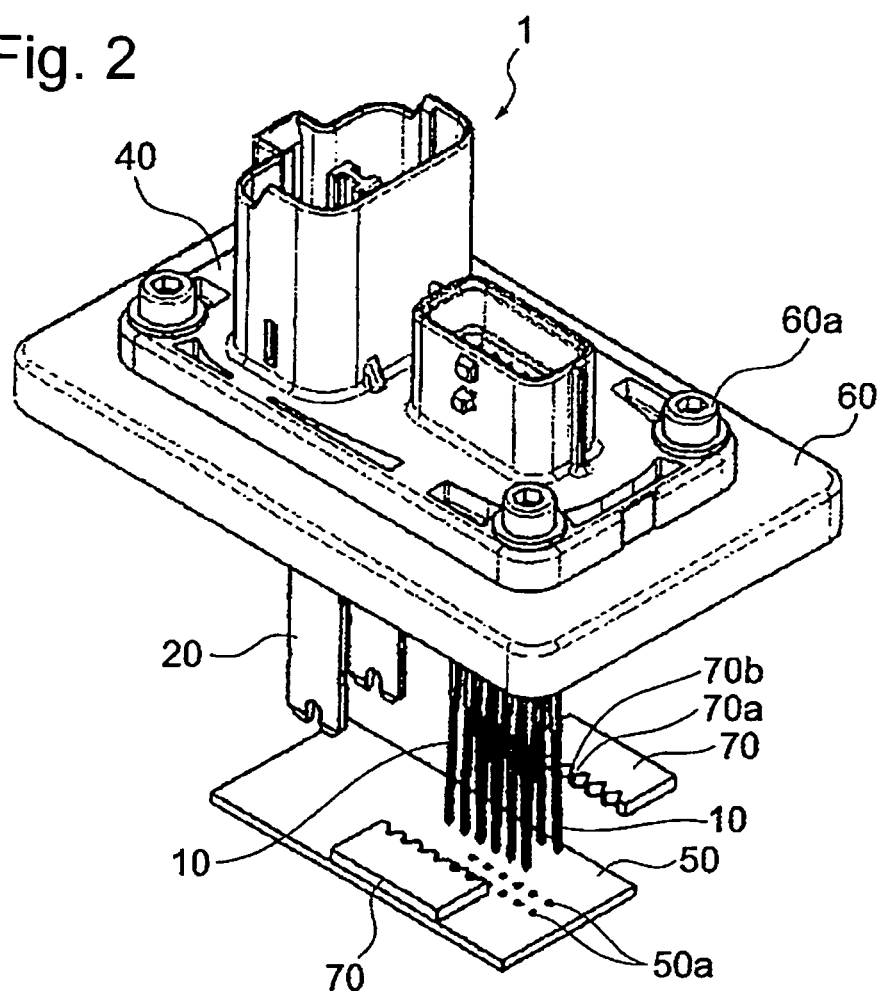
FIG. 2 is a view explaining such a situation that the connector shown in FIG. 1 is about to be inserted into a circuit substrate.

FIG. 1 is a perspective view showing a connector 1 that is manufactured by an insert molding method for a connector according to an embodiment of the present invention. FIG. 2 is a view explaining such a situation that the connector 1 shown in FIG. 1 is about to be inserted into a circuit substrate 50. The connector 1 is equipped with signal system terminals 10, power system terminals 20, bushes 30, and a housing 40.

Figure 3:
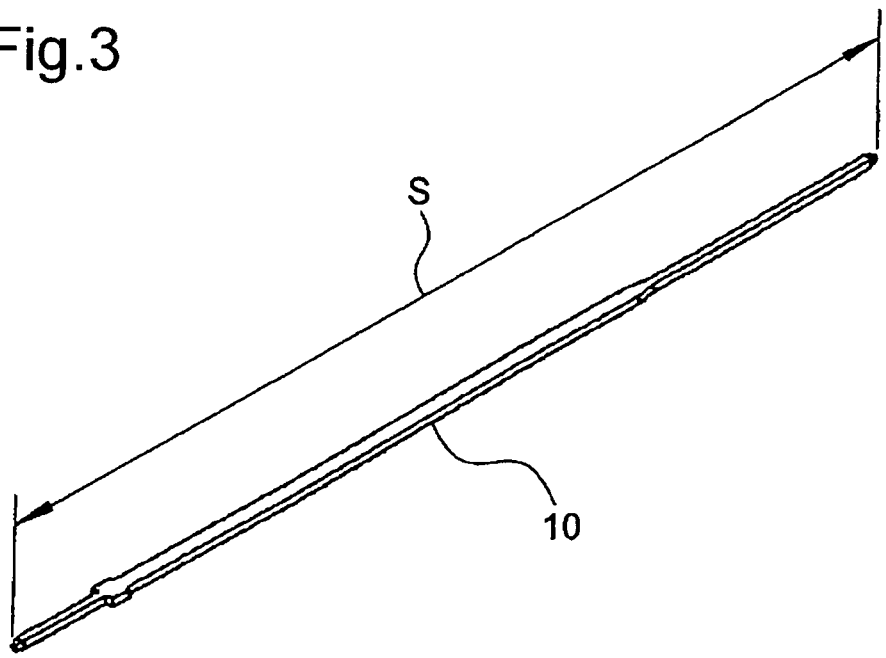
FIG. 3 is a perspective view of a signal system terminal shown in FIG. 1.
Figure 4:
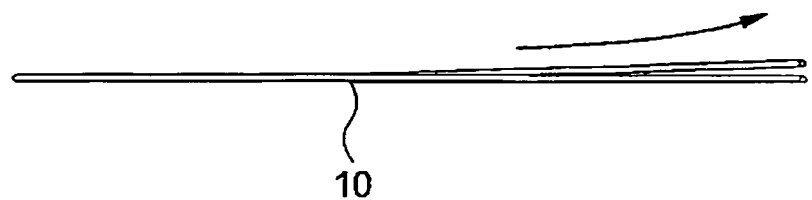
FIG. 4 is a view showing the signal system terminal that is in its warped state.

The signal system terminals 10 are connected to the circuit substrate 50, and correspond to the terminals that transmit a control signal of a small electric current respectively. As shown in FIG. 3, a dimension S of the signal system terminal 10 in the longitudinal direction is long, e.g., is about 76 mm. Therefore, as shown in FIG. 4, a warp in the longitudinal direction is caused after the press molding is applied.

The power system terminals 20 are welded to a power supply substrate (not shown), and correspond to the terminals that transmit a power supply current of a large electric current respectively. The bushes 30 constitute the fitting holes that are used to fit the housing 40 to a unit 60 described later.

As shown in FIG. 1, the connector 1 is constructed such that the signal system terminals 10, the power system terminals 20, and the bushes 30, all being the insert components, are integrated with the housing 40 by the insert molding. As shown in FIG. 2, the connector 1 is attached to the unit 60 by bolts 60a, then the signal system terminals 10 are soldered to the circuit substrate 50, and then the power system terminals 20 are welded on to the power supply substrate (not shown). The signal system terminals 10 are aligned in a row when a comb-teeth shaped jig 70 is put on to these terminals 10, i.e., each signal system terminal 10 gets into grooves 70b between comb teeth 70a respectively. Then, the signal system terminals 10 are inserted correspondingly into connection holes 50a of the circuit substrate 50 in their aligned state. Then, the signal system terminals 10 are soldered on to the circuit substrate 50.

Next, the insert molding method for the connector according to the present embodiment will be explained with reference to FIG. 5 hereunder. FIGS. 5A to D are views explaining the insert molding method for the connector.

Figure 5A:
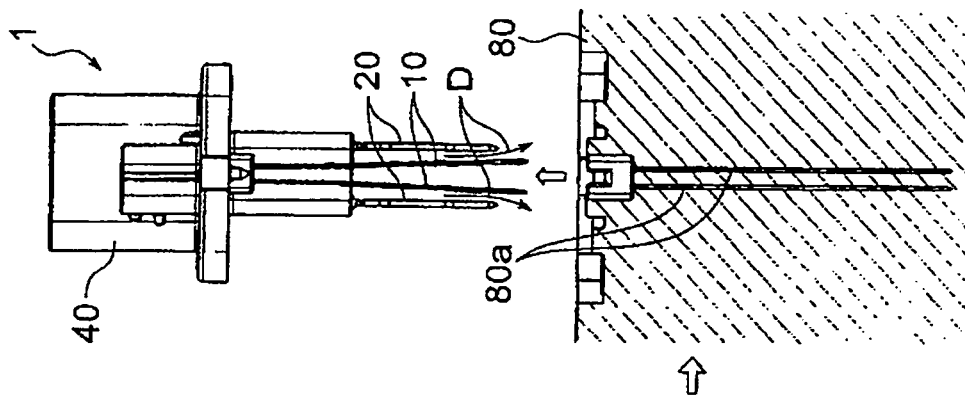
FIGS. 5 A to D are views explaining an insert molding method for a connector.
Figure 5B:
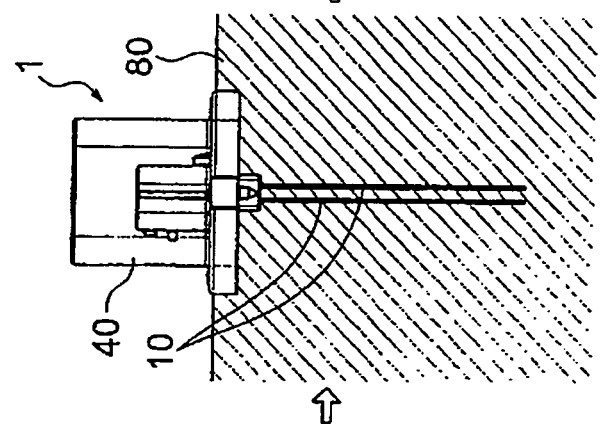

First, as shown in FIG. 5A, the signal system terminals 10 are set over a housing mold 80. That is, the signal system terminals 10 in two rows are set over the signal system terminal setting holes 80a while directing their warping directions D outward respectively. More concretely, the signal system terminals 10 in two rows are aligned respectively such that the warping directions D of all signal system terminals 10 in each row are directed outward in the direction, along which paired terminals in two rows out of all signal system terminals 10 are opposed to each other, respectively. Then, as shown in FIG. 5B, a plurality of signal system terminals 10 in two rows are inserted into signal system terminal setting holes 80a as the setting holes in the housing mold 80, as described in detail later.

Figure 5C:
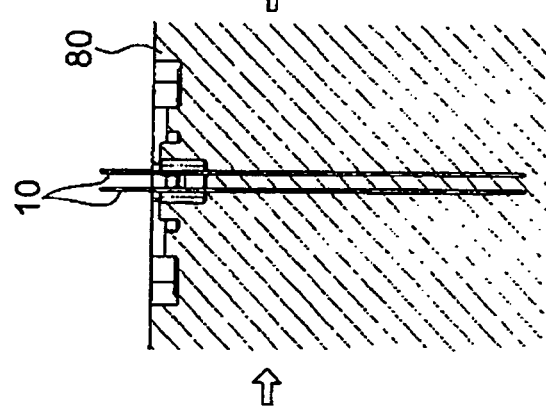

Then, as shown in FIG. 5C, a resin used to form the housing 40, etc. are injected into the housing mold 80, and thus the connector 1 in which the insert components are integrated with the housing 40 is molded. Although not shown in FIG. 5C, it is assumed that the setting of the power system terminal 20 and the bush 30, both prepared as the insert component, in the housing mold 80 should also be completed before the resin, etc. are injected into the housing mold 80.

Figure 5D:
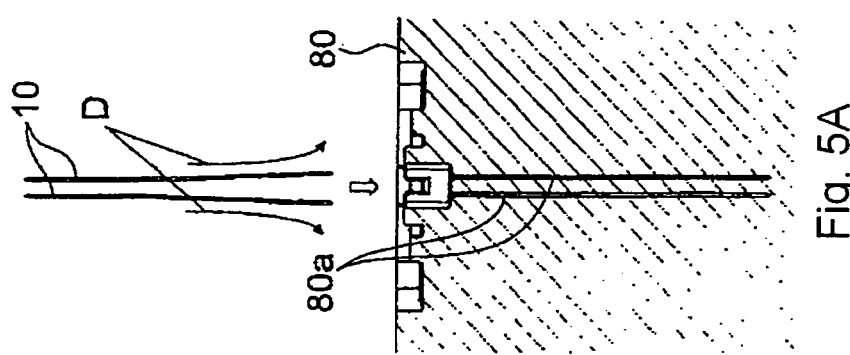

Then, as shown in FIG. 5D, the connector 1 is released from the housing mold 80, and thus the insert molding method for the connector according to the embodiment of the present invention is completed. In the connector 1 manufactured by this insert molding method for the connector, as shown in FIG. 5D, the warping directions D of respective signal system terminal 10 are still directed to the outer side of the rows of the terminals respectively. The reason for this is that, because the spring characteristics of the metal itself is tough, an amount of warp of the signal system terminals 10 would not be changed just after the signal system terminals 10 are set merely in the signal system terminal setting holes 80a of the housing mold 80.

Next, procedures required until the connector 1 that is manufactured by the insert molding method for the connector according to the embodiment of the present invention is inserted into the circuit substrate 50 will be illustrated hereunder. FIGS. 6 A to C are views illustrating procedures required until the connector 1 shown in FIG. 2 is inserted into the circuit substrate 50.

Figure 6C:
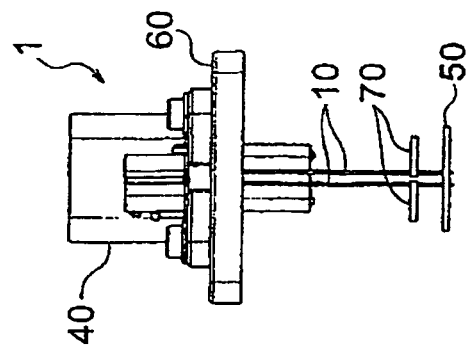
FIGS. 6 A to C are views illustrating the procedures required until the connector shown in FIG. 2 is inserted into the circuit substrate.
Figure 6B:
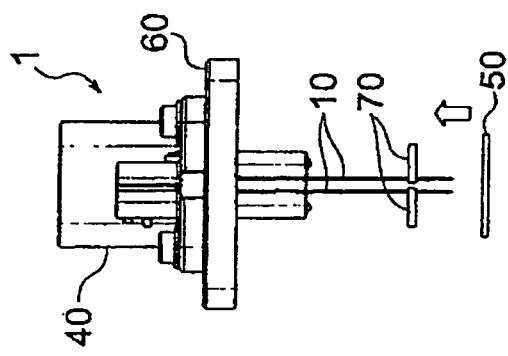
Figure 6A:
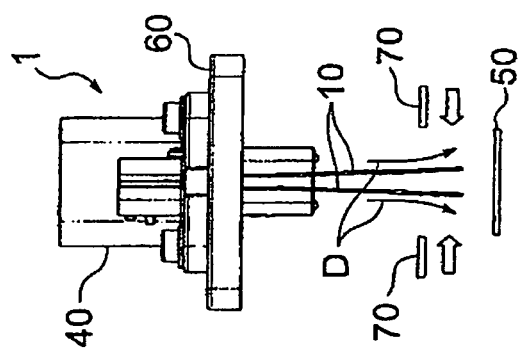

First, as shown in FIG. 6A, the connector 1 is arranged in the position where the signal system terminals 10 of the connector 1 substantially oppose to the connection holes 50a in the circuit substrate 50. At this time, the warping directions D of the signal system terminals 10 are directed toward the outer side of two rows of the terminals respectively.

Then, as shown in FIG. 6B, the comb-teeth shaped jig 70 is put on to the rows of the signal system terminals 10 from the outer side on both sides respectively. At this time, the warping directions D of the signal system terminals 10 are directed to the outer side of the rows. Therefore, the comb-teeth shaped jig 70 can be put on to the signal system terminals 10 in respective rows from the outer side of the rows of the terminals without fail respectively. That is, the signal system terminals 10 in two rows can be aligned without fail.

Then, as shown in FIG. 6C, the signal system terminals 10 are inserted into the connection holes in the circuit substrate 50. At this time, since the signal system terminals 10 are aligned by the comb-teeth shaped jig 70, these signal system terminals 10 can be inserted easily into the connection holes 50a in the circuit substrate 50.

In this embodiment, a plurality of signal system terminals 10 aligned in two rows are integrated with the housing 40 such that their warping directions D are directed to the outer side of the rows of the terminals respectively. Therefore, in the manufactured connector 1, the comb-teeth shaped jig 70 can be put on to the signal system terminals 10, which are already warped outward from respective rows, from the outer side of a plurality of signal system terminals 10 being aligned in two rows without fail respectively. As a result, the insertion of the signal system terminals 10 into the connection holes 50a in the circuit substrate 50 can be facilitated.

Also, in this embodiment, the signal system terminals 10, in which a warp in the longitudinal direction is easily caused because its dimension in the longitudinal direction is long, are integrated with the housing 40 such that the warping directions D are directed toward the outer side of the rows of the terminals respectively. Therefore, in the manufactured connector 1, the comb-teeth shaped jig 70 can be put on to the signal system terminals 10, which are already warped outward from the rows, from the outer side of a plurality of signal system terminals 10 aligned in two rows without fail respectively. As a result, the insertion of the easily warped signal system terminals 10 into the connection holes 50a in the circuit substrate 50 can be facilitated.

Also, in this embodiment, a warp correction or a warp suppression of respective signal system terminals 10, which is needed to correctly position the signal system terminals 10, can be omitted. Consequently, a cost reducing effect achieved by the omission of steps can be obtained.

Here, in this embodiment, the connector 1 having the signal system terminal 10 and the power system terminal 20 is illustrated, but the present invention is not limited this connector. The present invention may be applied to any connector if such connector has a plurality of terminals. In other words, the terminals whose warping directions D are put in predetermined directions are not limited to the signal system terminal 10, and other terminals may also be employed.

This application is based upon and claims the benefit of priority of Japanese Patent Application No. 2010-155500 filed on Jul. 8, 2010, the contents of which are incorporated herein by reference.

INDUSTRIAL APPLICABILITY

According to the insert molding method of the present invention, a plurality of signal system terminals that are aligned in two rows are set in the housing mold such that the warping direction are respectively directed to outer sides of the rows of the terminals. Therefore, in the manufactured connector, the comb-teeth shaped jig can be put on to the terminals, which are warped outward from the rows, from the outer side of the rows of the terminals without fail respectively. Consequently, the insertion of the terminals into insertion destination places for the terminals can be facilitated.

REFERENCE SIGN LIST 1 connector
10 signal system terminal
20 power system terminal
30 bush
40 housing
50 circuit substrate
50a connection hole

60 unit
60*a* bolt
70 comb-teeth shaped jig
70*a* comb tooth
70*b* groove
80 housing mold
80*a* signal system terminal setting hole
D warping direction

The invention claimed is:

1. An insert-molding method for insert-molding a connector including a plurality of terminals integrated with a housing and aligned in two rows, comprising:
  setting the plurality of terminals in a housing mold so as to align a uniform warping direction of the plurality of terminals,
  wherein the uniform warping direction is formed such that a warping direction of each terminal of the plurality of terminals is respectively directed outwardly from the two rows of the plurality terminals,
  wherein each terminal of the plurality of terminals has a warp in a longitudinal direction thereof as a result of press molding being applied prior to the step of setting the plurality of terminals in the housing mold.

2. The insert-molding method according to claim 1, further comprising:
  putting a comb-teeth shaped jig on to the two rows of the terminals from an outer side of the two rows of the terminals.

3. The insert-molding method according to claim 1, wherein each terminal of the plurality of terminals is a same shape.

* * * * *